United States Patent
Lee et al.

(10) Patent No.: US 10,135,024 B2
(45) Date of Patent: Nov. 20, 2018

(54) CURVED DISPLAY DEVICE

(71) Applicant: LG Display Co., Ltd., Seoul (KR)

(72) Inventors: Junjae Lee, Gyeonggi-do (KR); Myeongah Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/363,213

(22) Filed: Nov. 29, 2016

(65) Prior Publication Data

US 2017/0155087 A1    Jun. 1, 2017

(30) Foreign Application Priority Data

Dec. 1, 2015 (KR) .................. 10-2015-0169915

(51) Int. Cl.
| | | |
|---|---|---|
| *H01L 51/52* | (2006.01) | |
| *H01L 27/32* | (2006.01) | |
| *H01L 51/00* | (2006.01) | |
| *G02F 1/1333* | (2006.01) | |
| *G02F 1/1362* | (2006.01) | |

(52) U.S. Cl.
CPC ........ *H01L 51/5253* (2013.01); *G02F 1/1362* (2013.01); *G02F 1/133305* (2013.01); *H01L 27/3244* (2013.01); *H01L 51/0097* (2013.01)

(58) Field of Classification Search
CPC ............. H01L 51/0097; H01L 51/5253; H01L 2251/5338; H01L 27/3244; H01L 51/5246; H01L 27/3267; H01L 27/3262; H01L 27/3258; G02F 1/133308; G02F 1/133305; H05K 1/028; H05K 2201/055; H05K 2201/09845; H05K 2201/10106; H05K 2201/10128; H05K 2201/09036; G06F 1/1652

See application file for complete search history.

(56) References Cited

U.S. PATENT DOCUMENTS 9,029,846 B2 * 5/2015 Song ................... H01L 51/0097
                                                        257/40
9,485,858 B2 * 11/2016 Namkung .............. H05K 1/028
(Continued)

FOREIGN PATENT DOCUMENTS

| JP | 2008-089884 A | 4/2008 |
| JP | 2009-042565 A | 2/2009 |

OTHER PUBLICATIONS

Extended European Search Report dated Mar. 31, 2017 for corresponding European Patent Application No. 16201349.4.
(Continued)

*Primary Examiner* — Roy Potter
(74) *Attorney, Agent, or Firm* — Morgan, Lewis & Bockius LLP

(57) ABSTRACT

A curved display device has a plurality of layers including elements for implementing an input image, and has a neutral plane (NP), a first area positioned in any one of upper and lower sides of the NP with compressive stress applied thereto, and a second area positioned in the other of the upper and lower sides of the NP with a tensile stress applied thereto The curved display device includes at least one first curved portion; and at least one second curved portion bent in a direction different from a direction of the first curved portion. The first curved portion and the second curved portion are different in thickness, and positions of the NPs.

9 Claims, 14 Drawing Sheets

(56) References Cited

U.S. PATENT DOCUMENTS

| | | |
|---|---|---|
| 9,516,743 B2 * | 12/2016 | Kim ................. H05K 1/028 |
| 2009/0201443 A1 | 8/2009 | Sasaki et al. |
| 2014/0240985 A1 | 8/2014 | Kim et al. |
| 2014/0367644 A1 | 12/2014 | Song et al. |
| 2015/0146386 A1 | 5/2015 | Namkung et al. |
| 2016/0212840 A1 | 7/2016 | Koo et al. |

OTHER PUBLICATIONS

Japanese Office Action dated Nov. 2, 2017, issued in corresponding Japanese Application No. 2016-234416.

* cited by examiner (a)

<Inner Curved>

(b)

<Outer Curved>

(a)

(b)

(c)

(a)

(b)

CURVED DISPLAY DEVICE

This application claims the priority benefit of Korean Patent Application No. 10-2015-0169915 filed on Dec. 1, 2015 which is incorporated herein by reference for all purposes as if fully set forth herein.

BACKGROUND

Field of the Invention

The present disclosure relates to a curved display device having a first curved portion and a second curved portion bent in different directions.

Discussion of the Related Art

Various display devices reduced in weight and volume, solving the shortcomings of cathode ray tubes (CRTs), have been developed. Such display devices include a liquid crystal display (LCD), a field emission display (FED), a plasma display panel (PDP), an organic light emitting display device, and the like.

Display devices, having advantages of being thin in thickness and light in weight, have been commonly used in mobile communication terminals or portable information processing devices. In particular, demand for display panels which are thinner and lighter and consume less power has grown for portable or mobile devices. Such display devices are applied in various fields such as TVs, vehicle displays, wearable devices, and the like, as well as mobile devices such as smartphones, tablet PCs. Display devices are required to be structurally deformed in various manners so as to be applied to various fields.

Recently, curved display devices have been commercialized. For example, a curved display device including a plastic organic light emitting diode (OLED) may reproduce an input image on a display area of a display panel. The plastic OLED may be formed on a bendable plastic substrate. The OLED display device may be realized to have various designs and advantageous in terms of portability and durability.

FIG. 1 is a view illustrating an example of a display device. Referring to FIG. 1, a display device is bendable in a forward direction thereof (i.e., inwardly curved as shown in portion (a) of FIG. 1) or in a backward direction thereof (i.e., outwardly curved as shown in portion (b) of FIG. 1). When the curved display device is bent, stress acts above the display device. Here, stress equal to or greater than breaking strength is applied, devices formed within the display device may be cracked, or the like. Thus, in order to enhance reliability and product yield of the display device, a method for stably bending the display device is required.

SUMMARY

Accordingly, the present invention is directed to a curved display device that substantially obviates one or more of the problems due to limitations and disadvantages of the related art.

An object of the present disclosure is to provide a curved display device having curved portions in different directions, which was difficult to manufacture in the related art.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a curved display device has a plurality of layers including elements for implementing an input image, and has a neutral plane (NP), a first area positioned in any one of upper and lower sides of the NP with compressive stress applied thereto, and a second area positioned in the other of the upper and lower sides of the NP with tensile stress applied thereto. The curved display device comprises at least one first curved portion; and at least one second curved portion bent in a direction different from a direction of the first curved portion, wherein the first curved portion and the second curved portion are different in thickness, and positions of the NPs.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In describing several embodiments, the same components will be representatively described at the beginning and may be omitted in other embodiments.

It will be understood that, although the terms first, second, etc. may be used herein to describe various elements, these elements should not be limited by these terms. These terms are only used to distinguish one element from another.

A display device according to the present disclosure may be implemented on the basis of a liquid crystal display (LCD), a field emission display (FED), a plasma display panel (PDP), an organic light emitting display device, an electrophoresis display (EPD), a quantum dot display (QDD), and the like. Hereinafter, for the purposes of description, a case in which the display device includes an organic light emitting diode (OLED) device will be described as an example.

Figure 1:
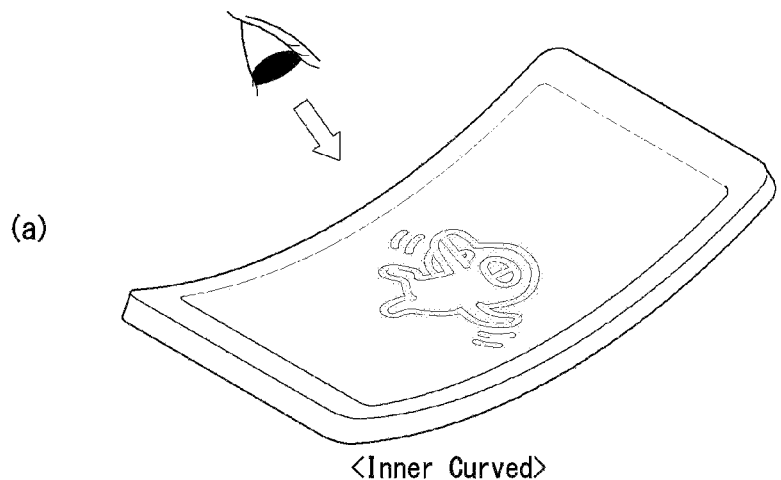
FIG. 1 is a view illustrating an example of a display device.
Figure 1:
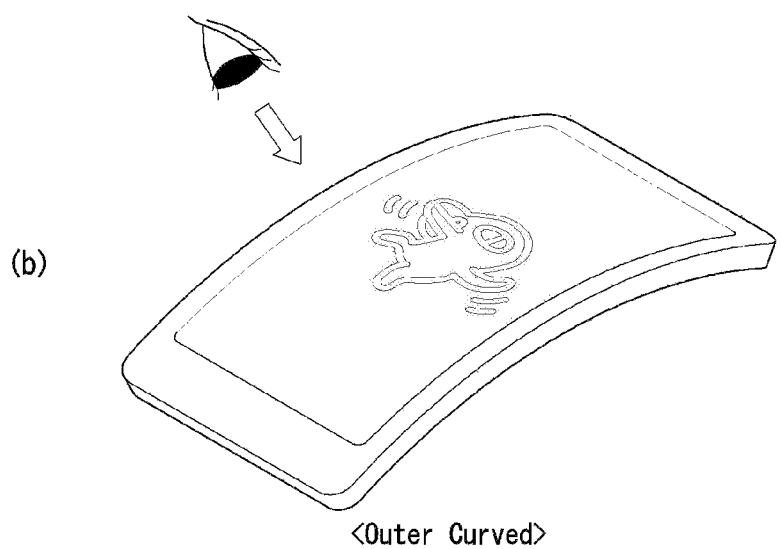
Figure 2:
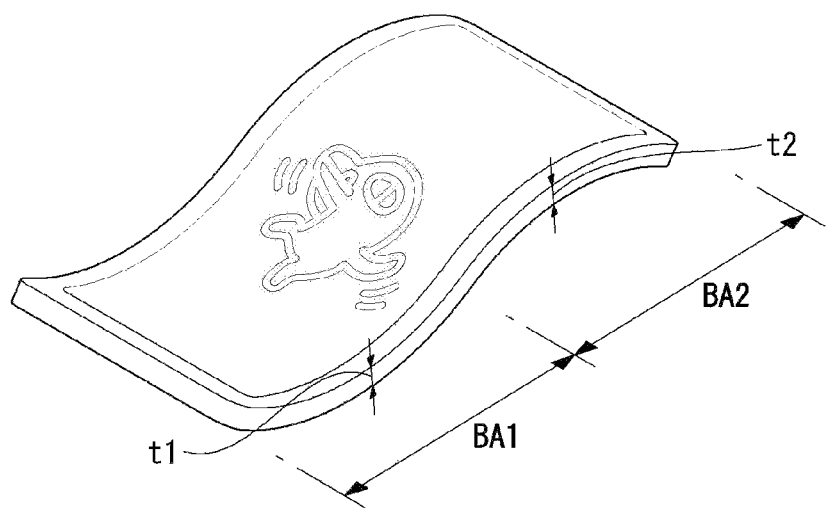
FIG. 2 is a perspective view schematically illustrating a curved display device according to an embodiment of the present disclosure.
Figure 3:
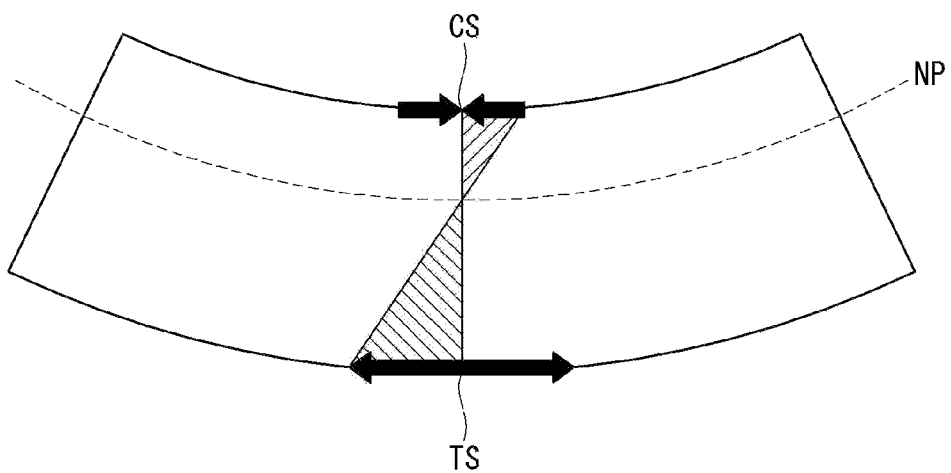
FIGS. 3 and 4 are views comparatively illustrating features of a curved display device according to an embodiment of the present disclosure.
Figure 4:
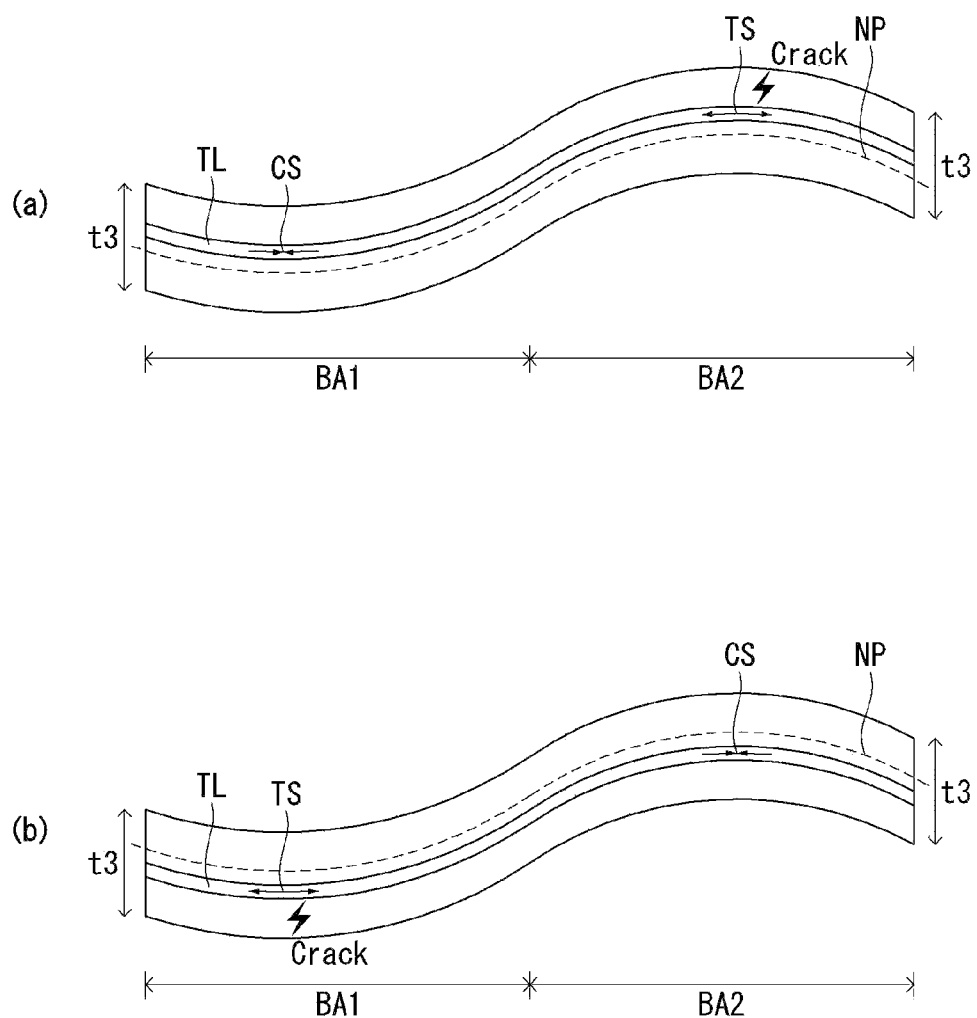

Hereinafter, a curved display device 100 according to the present disclosure will be described with respect to FIGS. 2 to 4. FIG. 2 is a perspective view schematically illustrating a curved display device according to an embodiment of the present disclosure. FIGS. 3 and 4 are views comparatively illustrating features of a curved display device according to an embodiment of the present disclosure.

Referring to FIG. 2, the curved display device 100 according to the present disclosure includes at least one first curved portion BA1 and at least one second curved portion BA2. A curved portion refers to an area bent to have a curved shape in a specific direction. The first curved portion BA1 and the second curved portion BA2 are bent in different directions. Hereinafter, for the purposes of description, a curved portion bent in a front surface direction of the curved display device will be defined as a first curved portion BA1 and a curved portion bent in a rear surface direction of the curved display device will be defined as a second curved portion BA2. The front surface direction of the curved display device 100 refers to a direction in which light is emitted to display an input image. Also, in the following descriptions, "above" refers to the front surface direction from a specific object, and "below" refers to a rear surface direction from a specific object.

The present disclosure aims at preventing cracks that may occur in a specific layer when the curved display device 100 is bent, by controlling a position of a neutral plane (NP) through a change in thickness of the curved display device 100. In particular, a layer vulnerable to a provided external force, that is, a layer that may be easily cracked by stress applied to the curved display device 100 (hereinafter, referred to as a "target layer (TL)") is positioned in the NP or positioned in a region where compressive stress CS acts.

Referring to FIG. 3, the NP is a plane where stress is 0 when the curved display device 100 is bent. In other words, the NP refers to a plane bent, while maintaining the original length without being increased or decreased, when a bending moment is applied. At the time of bending, compressive stress CS acts above an inner side of the bent curvature, and tensile stress TS acts above an outer side of the bent curvature. When the curved display device 100 is bent, a magnitude of the tensile stress or the compressive stress is determined in proportion to a distance from the NP. Thus, the magnitude of tensile stress or compressive stress is increased as a distance from the NP is increased.

When stress equal to or greater than breaking strength is applied to the curved display device 100 due to bending, elements formed within the curved display device 100 may be cracked or open-circuited. An element disposed in a region on which tensile stress TS acts may be more easily cracked than an element disposed in an area on which compressive stress CS acts. That is, elements are more vulnerable to generation of cracks when exposed to tensile stress TS than when they are exposed to compressive stress CS. Thus, in the present disclosure, the NP is adjusted such that a target layer TL is not disposed in an area to which tensile stress TS is provided.

A position of the NP may vary depending on a stacking structure of the curved display device 100. The NP may be positioned at the center of a member having a monolayer or a composite member including two or more stacked layers formed of materials having the same physical properties. However, in a case in which a plurality of elements or insulating layers having two or more different physical properties are stacked, like the curved display device 100, the NP may not be positioned at the center of the curved display device 100. A position of the NP may differ depending on physical properties, thicknesses, and the like, of respective layers constituting the curved display device 100.

In the present disclosure, a thickness t1 of the first curved portion BA1 and a thickness t2 of the second curved portion BA2 are different. When the thickness t1 of the first curved portion BA1 and the thickness t2 of the second curved portion BA2 are different, it means that at least one layer constituting the curved display device 100 has different thicknesses in the first curved portion BA1 and in the second curved portion BA2 or an additional layer having a predetermined thickness may be further provided in any one of the first curved portion BA1 and the second curved portion BA2.

Referring further to FIG. 4, when a thickness t3 of the curved display device 100 is uniform and the target layer TL is positioned above the NP, compressive stress CS is provided to the target layer TL of the first curved portion BA1 and tensile stress TS is provided to the target layer TL of the second curved portion BA2 (as shown in portion (a) of FIG. 4). When the thickness t3 of the curved display device 100 is uniform and the target layer TL is positioned below the NP, tensile stress TS is provided to the target layer TL of the first curved portion BA1 and compressive stress CS is provided to the target layer TL of the second curved portion BA2 (as shown in portion (b) of FIG. 4). In this manner, when the thickness t3 of the curved display device 100 is uniform, at least one of the target layer TL of the first curved portion BA1 and the target layer TL of the second curved portion BA2 is positioned in an area in which tensile stress TS is provided. The target layer TL positioned in an area where tensile stress TS is provided may be cracked to degrade element characteristics, or the like.

As described above, in the present disclosure, the NP is controlled by adjusting thicknesses of the first curved portion BA1 and the second curved portion BA2. The thicknesses of the first curved portion BA1 and the second curved portion BA2 are different. Due to the difference in thickness, positions of the NP in the first curved portion BA1 and the second curved portion BA2 are different. By controlling the NP, the target layer TL of the first curved portion BA1 and the target layer TL of the second curved portion BA2 may be positioned on the NP or may be positioned in an area where compressive stress CS is provided.

The target layer TL of the first curved portion BA1 and the target layer TL of the second curved portion BA2 may be the same layer or may be different layers. Also, in a case in which the first curved portions BA1 is in plurality, a thickness of at least one of the first curved portions BA1 may be different from a thickness of the other of the first curved portions BA1 and a position of the NP of at least one of the first curved portions BA1 may be different from a position of the NP of the other of the first curved portions BA1. in a case in which the second curved portions BA2 is in plurality, a thickness of at least one of the second curved portions BA2 may be different from a thickness of the other of the second curved portions BA2 a position of the NP of at least one of the second curved portions BA2 may be different from a position of the NP of the other of the second curved portions BA2.

In the present disclosure, without distinction of the first curved portion BA1 and the second curved portion BA2, stress acting on the target layer TL vulnerable to generation of cracks is minimized and tensile stress TS is not provided on target layer TL, whereby the curved display device 100 having a robust structure over an external force applied when bent may be provided.

Figure 5:
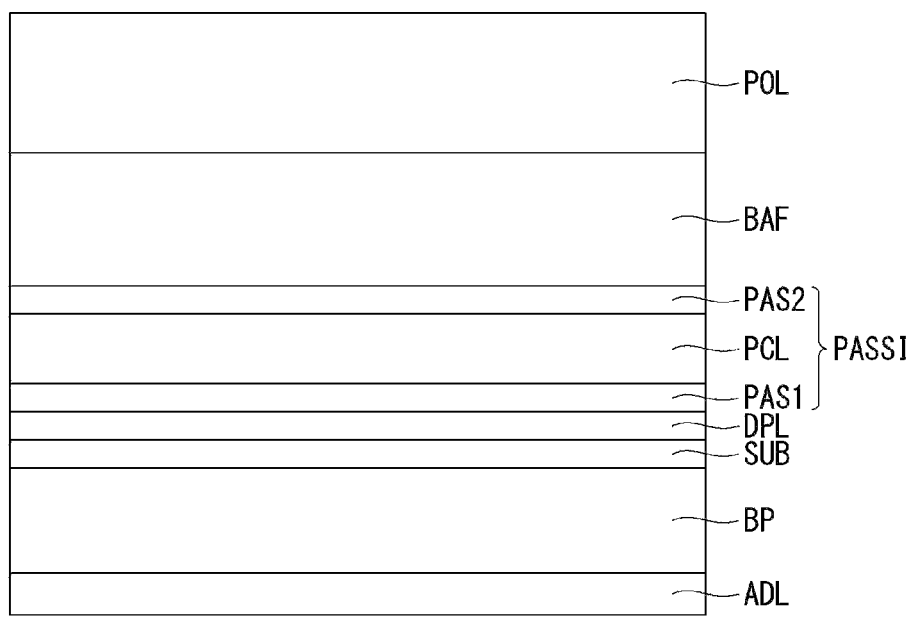
FIG. 5 is a cross-sectional view illustrating an example of a stacking structure of a curved display device according to an embodiment of the present disclosure.

Hereinafter, features of the present disclosure will be described in detail through an experimental example and embodiments of the present disclosure. FIG. 5 is a cross-sectional view illustrating an example of a stacking structure of a curved display device according to an embodiment of the present disclosure.

The curved display device 100 may include a substrate SUB, a display element layer DPL, a passivation layer PASSI, a barrier film BAF, an optical film POL, and the like.

The substrate SUB is formed of a material having flexibility selected from the group consisting of polyethylene naphthalate (PEN), polyethylene terephthalate (PET), polyethylene ether phthalate, polycarbonate (PC), polyarylate, polyether imide, polyether sulfonate, polyimide, or polyacrylate.

A back plate (BP) formed of a material such as PET, PC, or PEN, may be further formed on a lower surface of the substrate SUB. The back plate BP may prevent a foreign object from being attached to a lower portion of the substrate SUB and serve to buffer an impact applied from the outside. Graphite, or the like, may be additionally attached to the back plate BP.

An additional layer ADL may be further provided below the substrate SUB. The additional layer ADL may include a heat dissipation sheet, a thermally conductive film, an electromagnetic interference (EMI) film, an optical blocking film, and the like. Also, the additional layer ADL may include a PI or PET film. The heat dissipation sheet may include graphite. The thermally conductive film may include copper. However, the present disclosure is not limited thereto.

The display element layer DPL includes pixels defined by data lines and gate lines. Each of the pixels includes an organic light emitting diode (OLED), a self-luminous element. The OLED includes an anode electrode, a cathode electrode, and an organic compound layer interposed therebetween. The organic compound layer may include an emission layer (EML) and further include a common layer. The common layer may include at least one selected from the group consisting of a hole injection layer (HIL), a hole transport layer (HTL), an electron transport layer (ETL), and an electron injection layer (EIL).

Each of the pixels may include a driving thin film transistor (TFT) controlling a driving current flowing in the OLED according to a voltage between a gate and a source, a storage capacitor uniformly maintaining a voltage between the gate and the source of the driving TFT for one frame, and at least one switching TFT programming a voltage between the gate and the source of the driving TFT in response to a gate pulse (or a scan pulse). The driving current is determined by the voltage between the gate and the source of the driving TFT based on a data voltage and a threshold voltage of the driving TFT, and brightness of a pixel is proportional to a magnitude of the driving current flowing in the OLED.

Signal lines transferring each of the signals may be formed of a material with flexibility. For example, the signal lines may include any one of metal nanowire, metal mesh, and carbon nano-tube (CNT). However, the present disclosure is not limited thereto.

The passivation layer PASSI may be further formed to cover the TFT and the OLED. The passivation layer PASSI may be formed as a multi-layer in which one or more organic materials and inorganic materials are alternately stacked. The passivation layer PASSI is illustrated to include only a first inorganic film PAS1, an organic film PCL, and a second inorganic film PAS2, but the present disclosure is not limited thereto and the passivation layer PASSI may have any structure as long as it is able to protect an internal element from moisture and oxygen. For example, the passivation layer PASSI may have a structure in which a plurality of inorganic films and organic films PCL are alternately stacked to block penetration of moisture and oxygen. The passivation layer PASSI serves to protect an element of the curved display device 100 from moisture and oxygen which may be introduced from an external environment and/or an external force which may be applied from the outside. That is, the passivation layer PASSI serves as an encapsulation layer.

The barrier film BAF is further formed on the passivation layer PASSI to serve to prevent an introduction of oxygen, or the like. The barrier film BAF may be a plastic film formed of a flexible material and having gas permeability characteristics improved through an inorganic material or through multi-layer coating of an organic material and an inorganic material. Although not shown, a touch screen panel processing information on the basis of a sensed movement of a conductor may be further provided on the passivation layer PASSI. The substrate SUB with the passivation layer PASSI formed thereon and the touch screen panel may adhere to each other through an adhesive layer interposed therebetween. Here, the adhesive layer may include a material serving as a barrier.

The optical film POL may be disposed on the barrier film BAF to reduce reflection of light incident from the outside to enhance visibility. The optical film POL may include a polarizer film.

Figure 6:
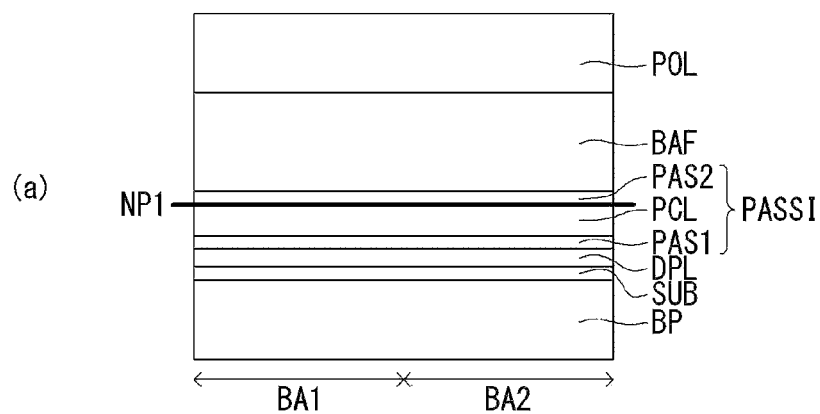
FIGS. 6 to 8 are views illustrating experimental examples of controlling a neutral plane.
Figure 6:
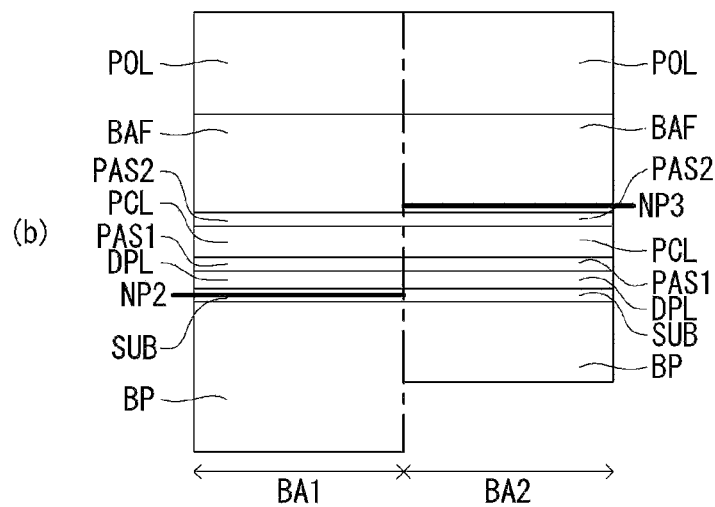
Figure 7:
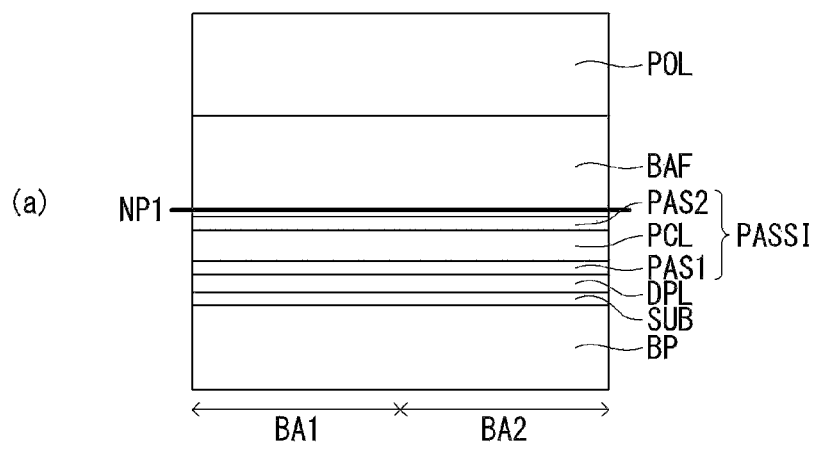
Figure 7:
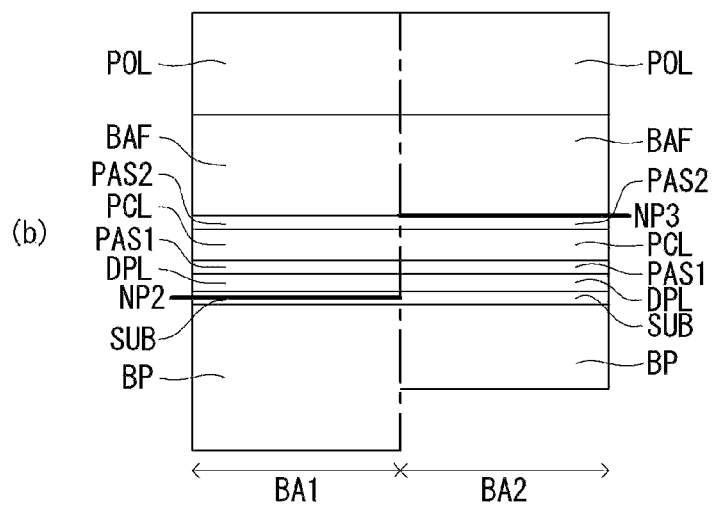
Figure 8:
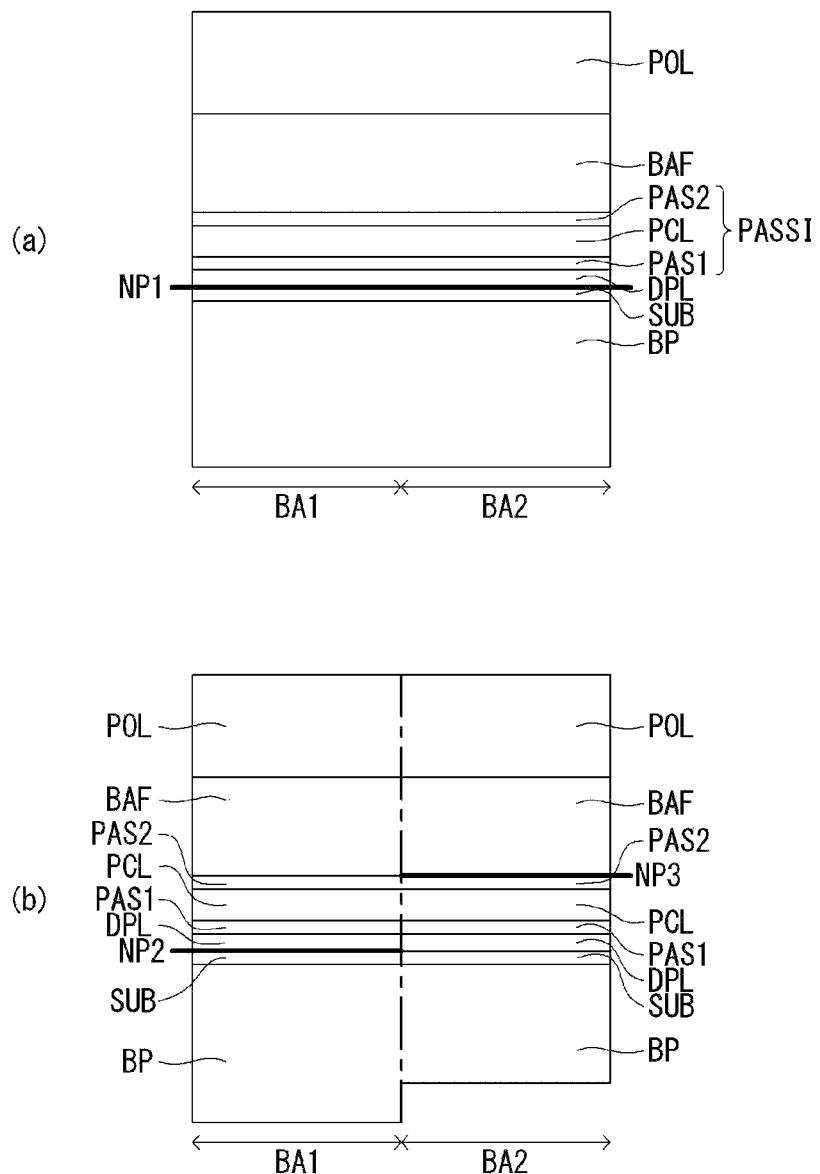
Figure 9:
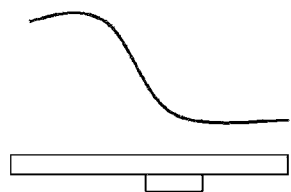
FIG. 9 is a view schematically illustrating relationships between a shape and a thickness of a bent curved display device.
Figure 9:
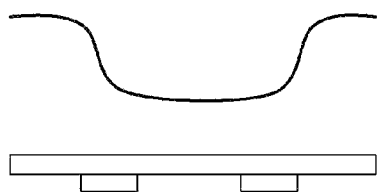
Figure 9:
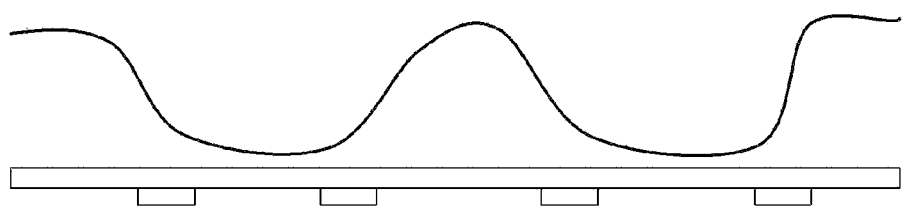

Hereinafter, a method for controlling the NP by adjusting a thickness of the curved display device 100 will be described in detail with reference to FIGS. 6 to 9. FIGS. 6 to 8 are views illustrating experimental examples of controlling a neutral plane. FIG. 9 is a view schematically illustrating relationships between a shape and a thickness of a bent curved display device.

Hereinafter, a case in which a target layer TL is the display element layer DPL and the passivation layer PASSI will be described as an example. When tensile stress acts above the display element layer DPL, a light emitting element or a driving element may be damaged or an open defect may easily occur. When tensile stress acts above the passivation layer PASSI, cracks may be easily generated and the generated cracks may propagate to the inside of the display element layer DPL. Moisture and oxygen may be introduced along the propagated cracks to degrade a light emitting element or a driving element. In order to prevent a degradation of reliability and stability due to such a defect, the display element layer DPL and the passivation layer PASSI are required to be prevented from being cracked at the time of bending.

A first experimental example based on a stacking structure of the aforementioned curved display device 100 will be described with reference to FIG. 6. Portion (a) of FIG. 6 is a view illustrating a thickness of the curved display device 100 and a position of an NP before improvement, and portion (b) of FIG. 6 is a view illustrating thicknesses of the curved display device in the first curved portion BA1 and the second curved portion BA2 and positions of NPs after improvement.

Before improvement, a first NP NP1 may be positioned between the second inorganic film PAS2 and an organic film PCL. When the first curved portion BA1 is bent, compressive stress acts above the first NP NP1 and tensile stress acts below the first NP NP1. Accordingly, the display element layer DPL, the organic film PCL, and the first inorganic film PAS1 positioned in the area where tensile stress is applied are vulnerable to cracks. When the second curved portion BA2 is bent, tensile stress acts above the first NP NP1 and compressive stress acts below the first NP NP1. Thus, the second inorganic film PAS2 positioned in the area where tensile stress is applied is vulnerable to cracks.

In order to prevent generation of cracks due to tensile stress applied to the display element layer DPL and/or portions of the passivation layer PASSI positioned in the first curved portion BA1 and the second curved portion BA2, the layer disposed below the first NP NP1 in the first curved portion BA1 is formed to be thicker and the layer disposed below the first NP NP1 in the second curved portion BA2 is formed to be thinner.

After improvement, a second NP NP2 of the first curved portion BA1 is positioned between the substrate SUB and the display element layer DPL. When the first curved portion BA1 is bent, compressive stress acts above the second NP NP2 and tensile stress acts below the second NP NP2. The display element layer DPL and the passivation layer PASSI positioned above the second NP NP2 are not positioned in the area where tensile stress is applied. That is, the display element layer DPL and the passivation layer PASSI are positioned in the area where the NP and compressive stress are provided. Thus, generation of cracks in the display device layer DPL and the passivation layer PASSI may be suppressed.

After improvement, a third NP NP3 of the second curved portion BA2 is positioned between the second inorganic film PAS2 and the barrier film BAF. When the second curved portion BA2 is bent, tensile stress acts above the third NP NP3 and compressive stress acts below the third NP NP3. The display element layer DPL and the passivation layer PASSI positioned below the third NP NP3 are not positioned in the area where tensile stress is applied. Thus, generation of cracks in the display element layer DPL and the passivation layer PASSI may be prevented.

After improvement, the second NP NP2 of the first curved portion BA1 and the third NP NP3 of the second curved portion BA2 are different in position. Also, the second NP NP2 and the third NP NP3 are different in position from the first NP NP1.

In an experimental example, a position of the NP is changed by adjusting a thickness of the layer disposed below the first NP NP1, but the present disclosure is not limited thereto. Although not shown, a position of the NP may be changed by adjusting a thickness of the layer disposed above the first NP NP1. For example, in the first curved portion BA1, the layer disposed above the NP1 may be formed to be thinner, and in the second curved portion BA2, the layer disposed above the first NP NP1 may be formed to be thicker.

A second experimental example based on a stacking structure of the curved display device 100 described above will be described with reference to FIG. 7. Portion (a) of FIG. 7 is a view illustrating a thickness of the curved display device 100 and a position of an NP before improvement, and portion (b) of FIG. 7 is a view illustrating thicknesses of the curved display device in the first curved portion BA1 and the second curved portion BA2 and positions of NPs after improvement.

Before improvement, a first NP NP1 may be positioned between the second inorganic film PAS2 and a barrier film BAF. When the first curved portion BA1 is bent, compressive stress acts above the first NP NP1 and tensile stress acts below the first NP NP1. Thus, the display element layer DPL and passivation layer PASSI positioned in the area where tensile stress is applied are vulnerable to cracks. When the second curved portion BA2 is bent, tensile stress acts above the first NP NP1 and compressive stress acts below the first NP NP1. Thus, the display element layer DPL and the passivation layer PASSI are not positioned in the area where the tensile stress is applied.

In order to prevent generation of cracks due to tensile stress applied to the display element layer DPL and the passivation layer PASSI positioned in the first curved portion BA1, the layer disposed below the first NP NP1 in the first curved portion BA1 is formed to be thicker. Since the display element layer DPL and the passivation layer PASSI corresponding to the target layer TL in the second curved portion BA2 are not positioned in the area where tensile stress is applied, a thickness of the second curved portion BA2 is not adjusted.

After improvement, a second NP NP2 of the first curved portion BA1 is positioned between the substrate SUB and the display element layer DPL. When the first curved portion BA1 is bent, compressive stress acts above the second NP NP2 and tensile stress acts below the second NP NP2. The display element layer DPL and the passivation layer PASSI positioned above the second NP NP2 are not positioned in the area where tensile stress is applied. That is, the display element layer DPL and the passivation layer PASSI are positioned in the area where the NP and the compressive stress are provided. Thus, generation of cracks in the display element layer DPL and the passivation layer PASSI may be prevented.

After improvement, the second NP NP2 of the first curved portion BA1 and the third NP NP3 of the second curved portion BA2 are different in position. Also, the second NP NP2 is different in position from the first NP NP1. The third NP NP3 is the same in position as that of the first NP NP1.

A third experimental example based on a stacking structure of the curved display device 100 described above will be described with reference to FIG. 8. Portion (a) of FIG. 8 is a view illustrating a thickness of the curved display device 100 and a position of an NP before improvement, and portion (b) of FIG. 8 is a view illustrating thicknesses of the curved display device in the first curved portion BA1 and the second curved portion BA2 and positions of NPs after improvement.

Before improvement, a first NP NP1 may be positioned between the substrate SUB and the display element layer DPL. When the first curved portion BA1 is bent, compressive stress acts above the first NP NP1 and tensile stress acts below the first NP NP1. Thus, the display element layer DPL and passivation layer PASSI are not positioned in the area where tensile stress is applied. When the second curved portion BA2 is bent, tensile stress acts above the first NP NP1 and compressive stress acts below the first NP NP1. Thus, the display element layer DPL and the passivation layer PASSI are positioned in the area where the tensile stress is applied so as to be vulnerable to cracks.

Since the display element layer DPL and the passivation layer PASSI corresponding to a target layer TL in the first curved portion BA1 are not positioned in the area where tensile stress is applied, a thickness of the second curved portion BA2 is not adjusted. In order to prevent generation of cracks due to tensile stress applied to the display element layer DPL and the passivation layer PASSI positioned in the second curved portion BA2, the layer disposed below the first NP NP1 in the second curved portion BA2 is formed to be thinner.

After improvement, a third NP NP3 of the second curved portion BA2 is positioned between the second inorganic film PAS2 and the barrier film BAF. When the second curved portion BA2 is bent, tensile stress acts above the third NP NP3 and compressive stress acts below the third NP NP3. The display element layer DPL and the passivation layer PASSI positioned below the third NP NP3 are not positioned in the area where tensile stress is applied. That is, the display element layer DPL and the passivation layer PASSI are positioned in the area where the NP and the compressive stress are provided. Thus, generation of cracks in the display element layer DPL and the passivation layer PASSI may be prevented.

After improvement, the second NP NP2 of the first curved portion BA1 and the third NP NP3 of the second curved portion BA2 are different in position. Also, the third NP NP3 is different in position from the first NP NP1. The second NP NP2 is the same in position as that of the first NP NP1.

Although not shown, the curved display device 100 according to an embodiment of the present disclosure may further include a planar portion, in addition to the first curved portion BA1 and the second curved portion BA2. The planar portion refers to an area having a planar shape in the curved display device 100. Also, in the planar portion, a thickness of the curved display device 100 may be adjusted such that a target layer TL is positioned in an area where the NP or compressive stress is provided. Also, in this case, thicknesses of the first covered portion BA1 and the second curved portion BA2 may be different and a thickness of the planar portion may be different to or the same as any one of the thickness of the first curved portion BA1 and the thickness of the second curved portion BA2. Also, an NP of the planar portion may be different from or the same as any one of the NP of the first curved portion BA1 and the NP of the second curved portion BA2.

FIG. 9 is a view schematically illustrating a relationship between a cross-sectional shape of the curved display device 100 having at least one first curved portion BA1 and at least one second curved portion BA2 and a thickness of the curved display device 100, corresponding to the cross-sectional shapes. Portion (a) of FIG. 9 is a view illustrating the curved display device 100 having a substantial S shape, portion (b) is a curved display device 100 having a substantial U shape, and portion (c) is a view illustrating a curved display device 100 having a substantial W shape. Here, the curved display device 100 and a thickness relationship thereof is merely an example, and the present disclosure is not limited thereto.

Embodiments of the present disclosure will be described with reference to FIGS. 10 to 14. Portion (a) and portion (b) of each of FIGS. 10 to 14 are views illustrating cross-sectional views and plan views schematically illustrating layers to be adjusted in thickness (or layers as thickness adjustment targets). However, the present disclosure is not limited to the embodiments described hereinafter. That is, embodiments of the present disclosure are merely examples to explain features of the present disclosure.

FIGS. 10 to 14 illustrate cases of adjusting a thickness of a back plate BP and/or an additional layer ADL in the curved display device 100 in order to control NPs of the first curved portion BA1 and the second curved portion BA2. However, the present disclosure is not limited thereto. For example, in the present disclosure, the NPs of the first curved portion BA1 and the second curved portion BA2 may be controlled by adjusting a thickness of at least one layer forming the curved display device 100, such as the substrate SUB, the optical film POL, and the inorganic films PAS1 and PAS2 and the organic film PCL constituting the passivation layer PASSI, and the like, as well as the back plate BP and the additional layer ADL described above. As a thickness adjusting method, various methods such as lamination, extruding, deposition, additional attachment, and the like, may be used.

Figure 10:
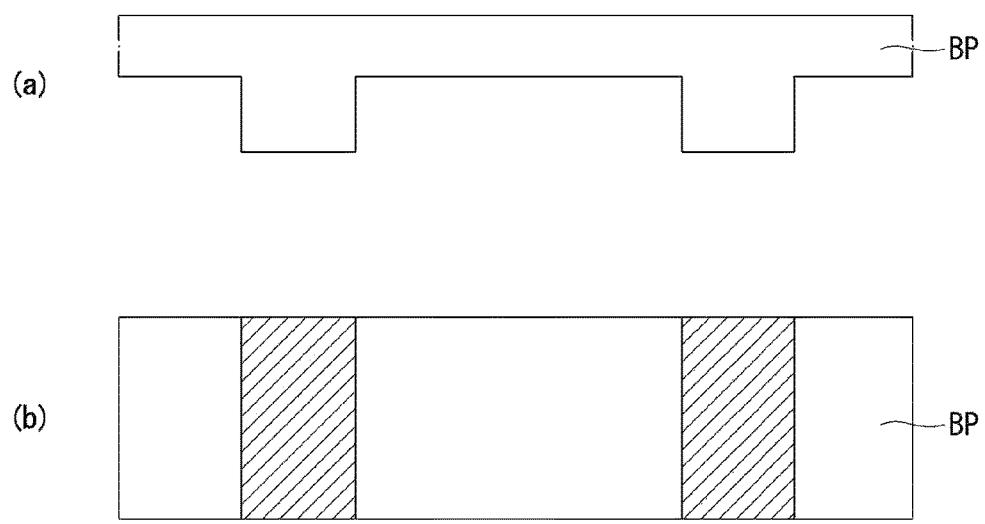
FIGS. 10 to 14 are views illustrating preferred embodiments of the present disclosure.

Referring to FIG. 10, in an embodiment of the present disclosure, in order to control the NP, a thickness of the back plate BP may be adjusted. A shape of a side surface of the back plate BP may have an irregular pattern. In the drawing, a case in which shapes of a concave portion and a convex portion have a rectangular or square shape is illustrated as an example, but the present disclosure is not limited thereto and at least any one of the concave portion and the convex portion may have various planar figure shape such as a polygonal shape, a semicircular shape, and the like. That is, in order to position the NP in the target layer TL, the back plate BP may have different thicknesses in the first curved portion BA1 and the second curved portion BA2, and thus, the back plate BP may have various shapes in a side surface thereof.

Figure 11:
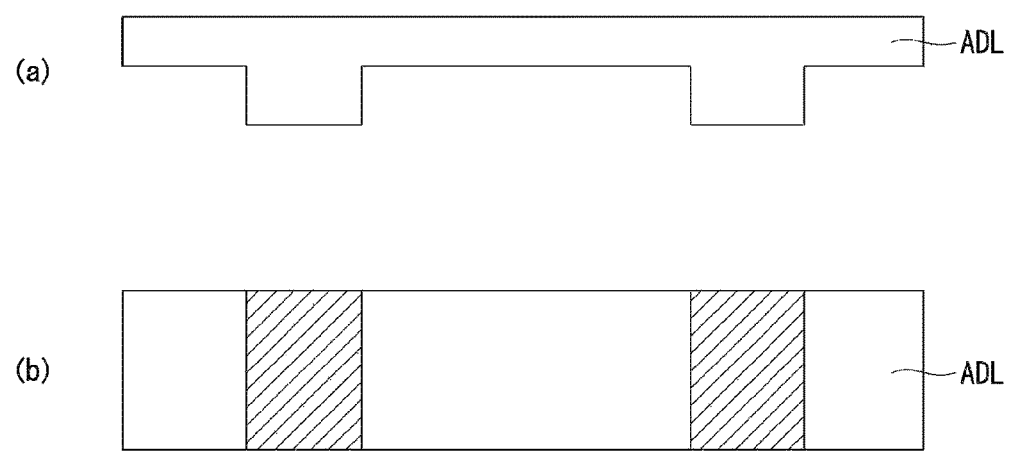

Referring to FIG. 11, in an embodiment of the present disclosure, in order to control the NP, a thickness of the additional layer ADL may be adjusted. A shape of a side surface of the additional layer ADL may have an irregular pattern. In the drawing, a case in which shapes of a concave portion and a convex portion have a rectangular or square shape is illustrated as an example, but the present disclosure is not limited thereto and at least any one of the concave portion and the convex portion may have various planar figure shape such as a polygonal shape, a semicircular shape, and the like. That is, in order to position the NP in the target layer TL, the additional layer ADL may have different thicknesses in the first curved portion BA1 and the second curved portion BA2, and thus, the additional layer ADL may have various shapes in a side surface thereof.

The additional layer ADL may be in plurality. Here, at least any one additional layer ADL may have different thicknesses in the first curved portion BA1 and the second curved portion BA2. In a case in which two or more additional layers ADL have different thicknesses in the first curved portion BA1 and the second curved portion BA2, shapes of side surfaces thereof may be different.

Figure 12:
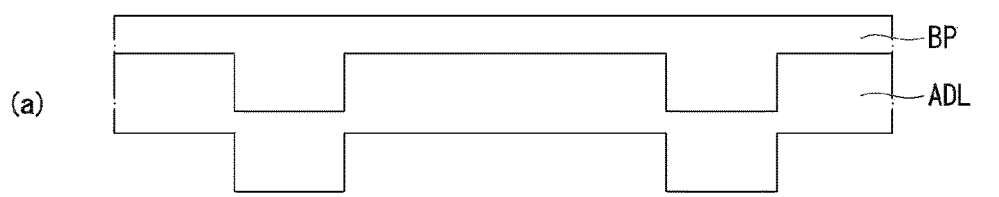
Figure 12:

Referring to FIG. 12, in an embodiment of the present disclosure, in order to control the NP, thicknesses of the back plate BP and the additional layer ADL may be adjusted. A shape of a side surface of the back plate BP may have an irregular pattern. In the drawing, a case in which shapes of a concave portion and a convex portion have a rectangular or square shape is illustrated as an example, but the present disclosure is not limited thereto and at least any one of the concave portion and the convex portion may have various planar figure shape such as a polygonal shape, a semicircular shape, and the like. That is, in order to position the NP in the target layer TL, each of the back plate BP and the additional layer ADL may have different thicknesses in the first curved portion BA1 and the second curved portion BA2, and thus, the back plate BP and the additional layer ADL may have various shapes in a side surface thereof.

Figure 13:
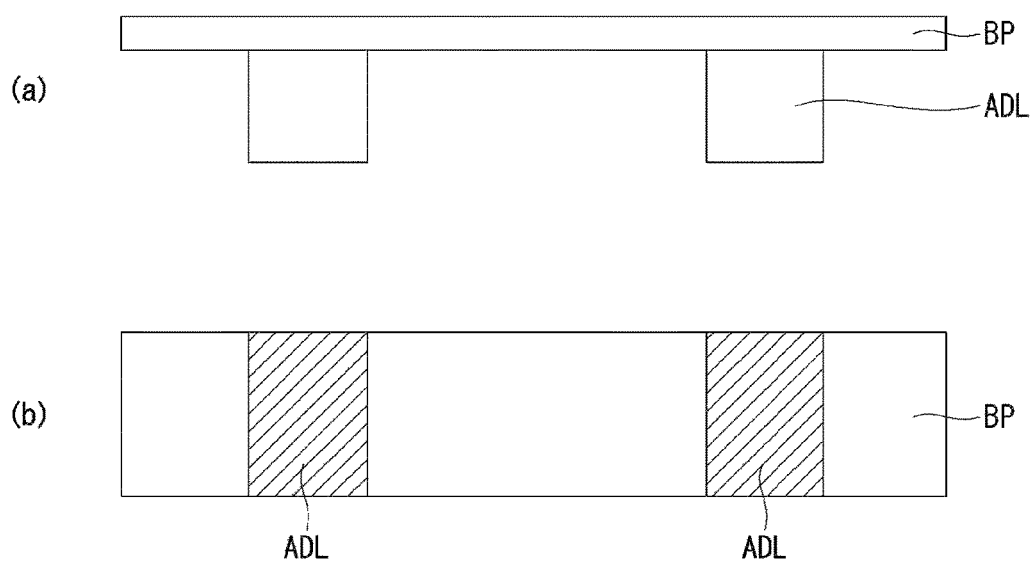

Referring to FIG. 13, in an embodiment of the present disclosure, in order to control the NP, the additional layer ADL may be formed in an area where a thickness of the first curved portion BA1 and the second curved portion BA2 is required to be increased. In the drawing, a case in which a shape of a side surface of the additional layer ADL is substantially a rectangular or square shape is illustrated as an example, but the present disclosure is not limited thereto and the additional layer ADL may have various planar figure shape such as a polygonal shape, a semicircular shape, and the like. In a case in which the additional layer ADL is formed in plurality, any one of the plurality of additional layers ADL may have a side surface having a shape different from that of another.

Figure 14:
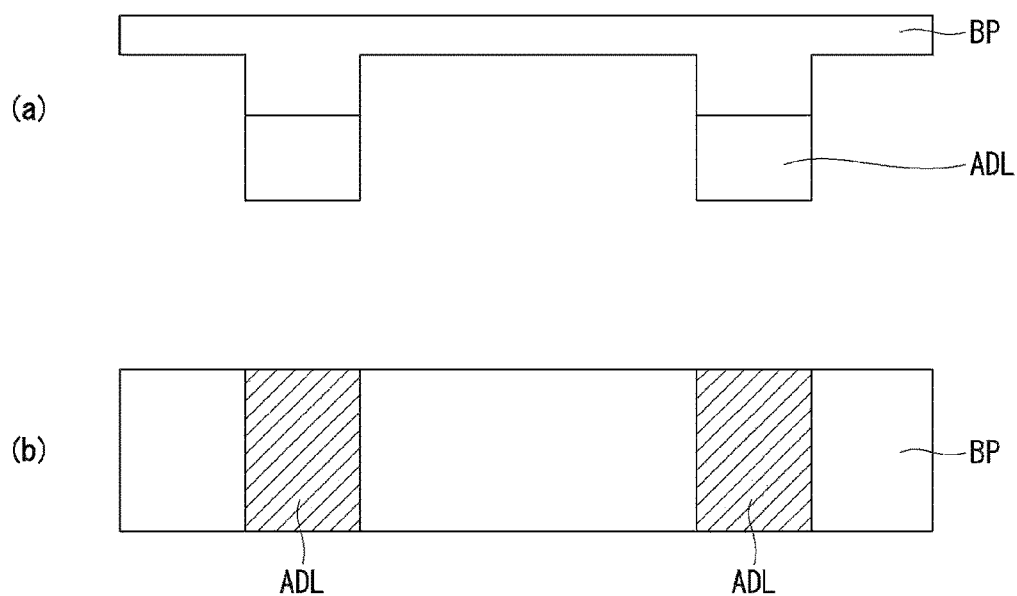

Referring to FIG. 14, in an embodiment of the present disclosure, in order to control the NP, the back plate BP and the additional layer ADL may be used. In an embodiment of the present disclosure, a thickness of the back plate BP may be adjusted. A shape of a side surface of the back plate BP may have an irregular pattern. In the drawing, a case in which shapes of a concave portion and a convex portion have a rectangular or square shape is illustrated as an example, but the present disclosure is not limited thereto and at least any one of the concave portion and the convex portion may have various planar figure shape such as a polygonal shape, a semicircular shape, and the like.

An additional layer ADL may be further formed in an area corresponding to the convex portion. In the drawing, a case in which a shape of a side surface of the additional layer ADL is substantially a rectangular or square shape is illustrated as an example, but the present disclosure is not limited thereto and the formed additional layer ADL may have various planar figure shape such as a polygonal shape, a semicircular shape, and the like. In a case in which the additional layer ADL is formed in plurality, any one of the plurality of additional layers ADL may have a side surface having a shape different from that of another.

In an embodiment of the present disclosure, the back plate BP having different thicknesses in the first curved portion BA1 and the second curved portion BA2 is provided, and the additional layer ADL is further formed below the back plate BP in an area where a thickness is required to be changed to be increased in the first curved portion BA1 and the second curved portion BA2, thereby controlling a position of the NP.

In an embodiment of the present disclosure, curved portions bent in different directions are provided. In an embodiment of the present disclosure, by controlling the NP of each curved portions bent in different directions, stress acting on a target layer vulnerable to generation of cracks is minimized and tensile stress may not be applied. Thus, the present disclosure provides the curved display device having a structure robust from an external force applied at the time of bending.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A curved display device having a plurality of layers including elements for implementing an input image, and having a neutral plane (NP), a first area positioned in any one of upper and lower sides of the NP and having compressive stress applied thereto, and a second area positioned in the other of the upper and lower sides of the NP and having tensile stress applied thereto, the curved display device comprising:
   at least one first curved portion; and
   at least one second curved portion bent in a direction different from a direction of the first curved portion,
   wherein the first curved portion and the second curved portion are different in thickness, and in positions of the NP.

2. The curved display device of claim 1, wherein:
   the plurality of layers include a predetermined target layer; and
   a target layer of the first curved portion and a target layer of the second curved portion are positioned in the NP or in the first area.

3. The curved display device of claim 2, wherein at least any one of one first curved portions is different from another first curved portion in thickness and in position of the NP.

4. The curved display device of claim 2, wherein at least any one of one second curved portions is different from another second curved portion in thickness and in position of the NP.

5. The curved display device of claim 2, wherein the target layer of the first curved portion is different from the target layer of the second curved portion.

6. A curved display device having a plurality of layers including elements for implementing an input image, and having a neutral plane (NP), a first area positioned in any one of upper and lower sides of the NP and having compressive stress applied thereto, and a second area positioned in the other of the upper and lower sides of the NP and having tensile stress applied thereto, the curved display device comprising:
   at least one first curved portion; and
   at least one second curved portion bent in a direction different from a direction of the first curved portion,
   wherein the first curved portion and the second curved portion are different in thickness, and in positions of the NPs, and
   wherein at least any one of the plurality of layers has different thicknesses in the first curved portion and the second curved portion.

7. The curved display device of claim 6, wherein at least any one of two or more layers having different thicknesses in the first curved portion and the second curved portion has a shape of a side surface different from a shape of a side surface of another layer.

8. The curved display device of claim 1, further comprising an additional layer in at least any one of the first curved portion and the second curved portion.

9. A curved display device having a plurality of layers including elements for implementing an input image, and having a neutral plane (NP), a first area positioned in any one of upper and lower sides of the NP and having compressive stress applied thereto, and a second area positioned in the other of the upper and lower sides of the NP and having tensile stress applied thereto, the curved display device comprising:
   a planar portion having a planar shape,
   at least one first curved portion; and
   at least one second curved portion bent in a direction different from a direction of the first curved portion,
   wherein the first curved portion and the second curved portion are different in thickness, and in positions of the NPs, and
   wherein the planar portion is different from any one of the first curved portion and the second curved portion in thickness and position of the NP.

* * * * *